United States Patent
Kim et al.

(10) Patent No.: US 9,240,461 B2
(45) Date of Patent: Jan. 19, 2016

(54) METHOD FOR FABRICATING SEMICONDUCTOR DEVICE

(71) Applicant: Samsung Electronics Co., Ltd., Suwon-si (KR)

(72) Inventors: Seok-Hoon Kim, Hwaseong-si (KR); Dong-Chan Suh, Seoul (KR); Byeong-Chan Lee, Yongin-s (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 13/932,047

(22) Filed: Jul. 1, 2013

(65) Prior Publication Data

US 2014/0024192 A1   Jan. 23, 2014

(30) Foreign Application Priority Data

Jul. 20, 2012 (KR) .................. 10-2012-0079355

(51) Int. Cl.

| | |
|---|---|
| *H01L 21/768* | (2006.01) |
| *H01L 29/66* | (2006.01) |
| *H01L 21/764* | (2006.01) |
| *H01L 29/78* | (2006.01) |
| *H01L 29/165* | (2006.01) |
| *H01L 29/49* | (2006.01) |
| *H01L 29/51* | (2006.01) |

(52) U.S. Cl.
CPC .......... *H01L 29/6656* (2013.01); *H01L 21/764* (2013.01); *H01L 21/7682* (2013.01); *H01L 29/165* (2013.01); *H01L 29/6653* (2013.01); *H01L 29/66545* (2013.01); *H01L 29/66636* (2013.01); *H01L 29/7848* (2013.01); *H01L 29/4966* (2013.01); *H01L 29/517* (2013.01)

(58) Field of Classification Search
CPC .................. H01L 21/8232; H01L 21/8239
See application file for complete search history.

(56) References Cited

U.S. PATENT DOCUMENTS

| | | | |
|---|---|---|---|
| 5,914,519 A | 6/1999 | Chou et al. | |
| 5,915,182 A | 6/1999 | Wu | |
| 6,107,667 A | 8/2000 | An et al. | |
| 6,180,988 B1 | 1/2001 | Wu | |
| 7,579,231 B2 | 8/2009 | Matsuo et al. | |
| 7,691,712 B2 | 4/2010 | Chidambarrao et al. | |
| 7,812,411 B2 | 10/2010 | Cheng | |
| 7,838,373 B2 | 11/2010 | Giles et al. | |
| 2009/0001480 A1* | 1/2009 | Cheng | 257/387 |
| 2010/0001409 A1 | 1/2010 | Humbert et al. | |
| 2011/0260220 A1 | 10/2011 | Chi et al. | |
| 2011/0266511 A1 | 11/2011 | Shen et al. | |
| 2011/0266682 A1 | 11/2011 | Edelstein et al. | |
| 2011/0298013 A1 | 12/2011 | Hwang et al. | |
| 2012/0104514 A1* | 5/2012 | Park et al. | 257/411 |
| 2014/0138779 A1* | 5/2014 | Xie et al. | 257/401 |

FOREIGN PATENT DOCUMENTS

KR   1020050121521 A   12/2005

* cited by examiner

*Primary Examiner* — Cheung Lee
(74) *Attorney, Agent, or Firm* — Myers Bigel Sibley & Sajovec, P.A.

(57) ABSTRACT

A method for fabricating a semiconductor device comprises forming a dummy gate pattern and a spacer that is arranged on a sidewall of the dummy gate pattern on a substrate, forming an air gap on both sides of the dummy gate pattern by removing the spacer, exposing the substrate by removing the dummy gate pattern, and sequentially forming a gate insulating film including a high-k insulating film and a metal gate electrode on the exposed substrate.

14 Claims, 13 Drawing Sheets

METHOD FOR FABRICATING SEMICONDUCTOR DEVICE

CROSS-REFERENCE TO RELATED APPLICATION

This application claims priority under 35 U.S.C. §119 from Korean Patent Application No. 10-2012-0079355 filed on Jul. 20, 2012 in the Korean Intellectual Property Office, the disclosure of which is incorporated herein by reference in its entirety.

BACKGROUND

The present invention relates to a method for fabricating a semiconductor device.

With the development of electronic technology, efforts to down-size semiconductor devices are rapidly occurring. Since semiconductor devices may require high operating speeds and accuracy in operation, research for optimizing the structure of transistors that are included in semiconductor devices have been under way.

SUMMARY

Embodiments of the present invention provide methods for fabricating semiconductor devices which can reduce capacitive coupling between a gate and a source and/or a drain by forming a gate spacer using a material having low permittivity and an air gap.

Additional advantages, subjects, and features of the invention will be set forth in part in the description which follows and in part will become apparent to those having ordinary skill in the art upon examination of the following or may be learned from practice of the invention.

According to an aspect of the present invention, there is provided a method for fabricating a semiconductor device, the method comprising, forming a dummy gate pattern on a substrate, forming a spacer on a sidewall of the dummy gate pattern and on the substrate, forming an air gap on both sides of the dummy gate pattern by removing the spacer, exposing the substrate by removing the dummy gate pattern, and sequentially forming a gate insulating film including a high-k insulating film and a metal gate electrode on the exposed substrate.

According to another aspect of the present invention, there is provided a method for fabricating a semiconductor device, the method comprising forming a dummy gate pattern that includes a high-k gate insulating film and a dummy gate electrode on a substrate, forming a spacer on a sidewall of the dummy gate pattern, forming an air gap on both sides of the dummy gate pattern by removing the spacer, and forming a metal gate electrode on the high-k gate insulating film after removing the dummy gate electrode.

According to another aspect of the present invention, there is provided a method for fabricating a semiconductor device, the method comprising forming a first gate electrode and a second gate electrode on a substrate, forming an interlayer pattern between the first and second gate electrodes, conformally forming a first layer on the first and second gate electrodes and on the interlayer pattern; and then forming a blocking film on the first and second gate electrodes and on the interlayer pattern, where the blocking film only partially fills a first air gap between the first gate electrode and the interlayer pattern, and only partially fills a second air gap between the second gate electrode and the interlayer pattern.

BRIEF DESCRIPTION OF THE DRAWINGS

The present invention will be more apparent from the following detailed description taken in conjunction with the accompanying drawings, in which.

DETAILED DESCRIPTION OF THE EMBODIMENTS

Figure 1:
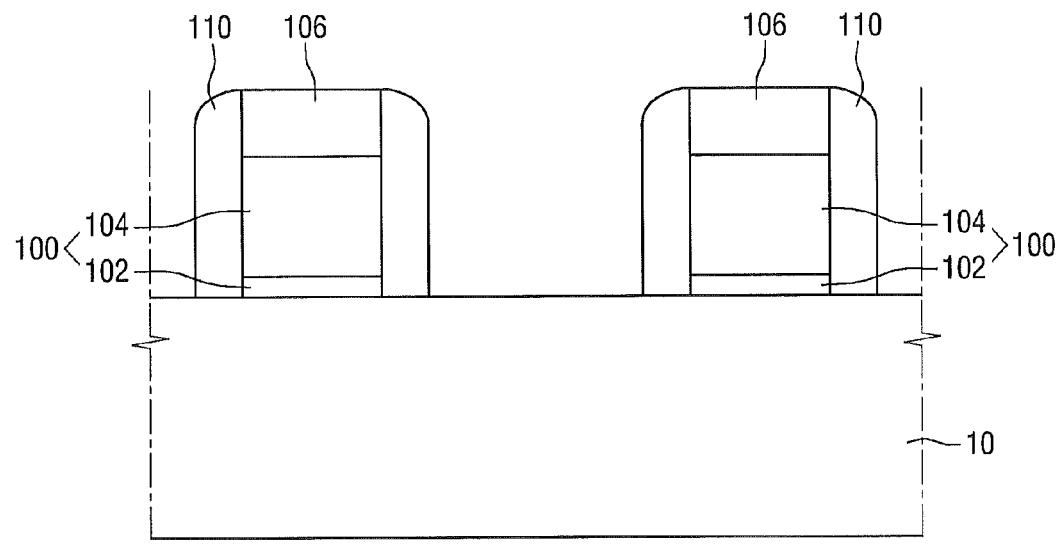
FIGS. 1 to 12 are views explaining intermediate steps of a method for fabricating a semiconductor device according to an embodiment of the present invention.

The present invention will now be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified.

FIGS. 1 to 12 are views explaining intermediate steps of a method for fabricating a semiconductor device according to an embodiment of the present invention.

Referring to FIG. 1, a dummy gate pattern 100 may be formed on a substrate 10. Spacers 110 are formed on sidewalls of the dummy gate pattern 100. The dummy gate pattern 100 may be formed by sequentially forming a dummy gate insulating film 102 and a dummy gate electrode 104 on the substrate 10. On an upper portion of the dummy gate pattern 100, a gate hard mask 106 may be further formed. In the case where the gate hard mask 106 is formed, the spacer 110 may be formed on sidewalls of the dummy gate pattern 100 and the gate hard mask 106, as shown.

In order to form the dummy gate pattern 100 and the gate hard mask 106, a dummy insulating film, a dummy electrode film, and a hard mask film may be sequentially formed on the substrate 10. A mask pattern (not illustrated) for forming the dummy gate pattern 100 and the gate hard mask 106 may be formed on the hard mask film. By etching the dummy electrode film and the dummy insulating film using the mask pattern as a mask, the dummy gate pattern 100 and the gate hard mask 106 may be formed on the substrate 10. Then, a spacer film that covers the dummy gate pattern 100 may be formed on the substrate 10. By performing directional etching with respect to the spacer film, the spacer 110 may be formed on the sidewalls of the dummy gate pattern 100 and the gate hard mask 106.

The substrate 10 may be made, for example, of bulk silicon or SOI (Silicon-On-Insulator). The substrate 10 may be a silicon substrate, or may be made of other materials, such as silicon and germanium, indium antimonide, lead telluride, indium arsenide, indium phosphide, gallium arsenide, or gallium antimonide, but is not limited thereto. In the method for fabricating a semiconductor device according to the present invention, a case where the substrate 10 is a silicon substrate will be described. The dummy insulating film may comprise, for example, one of a silicon oxide film ($SiO_2$), a silicon oxynitride film (SiON), and a combination thereof. The dummy insulating film may be formed using, for example, a thermal process, a chemical material process, atomic layer deposition (ALD), or chemical vapor deposition (CVD). The dummy electrode film may be made of, for example, silicon, and specifically, may include one of polycrystalline silicon (poly Si), amorphous silicon (a-Si), and a combination thereof. The polycrystalline silicon may be formed using, for example, sputtering, chemical vapor deposition, plasma deposition, or the like, but is not limited thereto. The hard mask film may include, for example, a nitride film, an oxide film, and a combination thereof. The hard mask film may be formed using, for example, the chemical vapor deposition. The spacer film may include, for example, a nitride film or an oxide film, and may be formed by chemical vapor deposition.

In the fabricating method to be described hereinafter, since the gate hard mask 106 and the spacer 110 may be simultaneously etched and removed, the gate hard mask 106 and the spacer 110 may be made of the same material or materials that are etched by the same gas or etchant. The gate hard mask 106 and the spacer 110 may have an etching selection ratio with respect to neighboring films such as, for example, the inter-layer insulation film and the like. It is sufficient if the gate hard mask 106 and the spacer 110 satisfy the above-described conditions. However, in the method for fabricating a semiconductor device according to an embodiment of the present invention, explanation will be made under the assumption that the gate hard mask 106 and the spacer 110 are made of silicon nitride.

Figure 2:
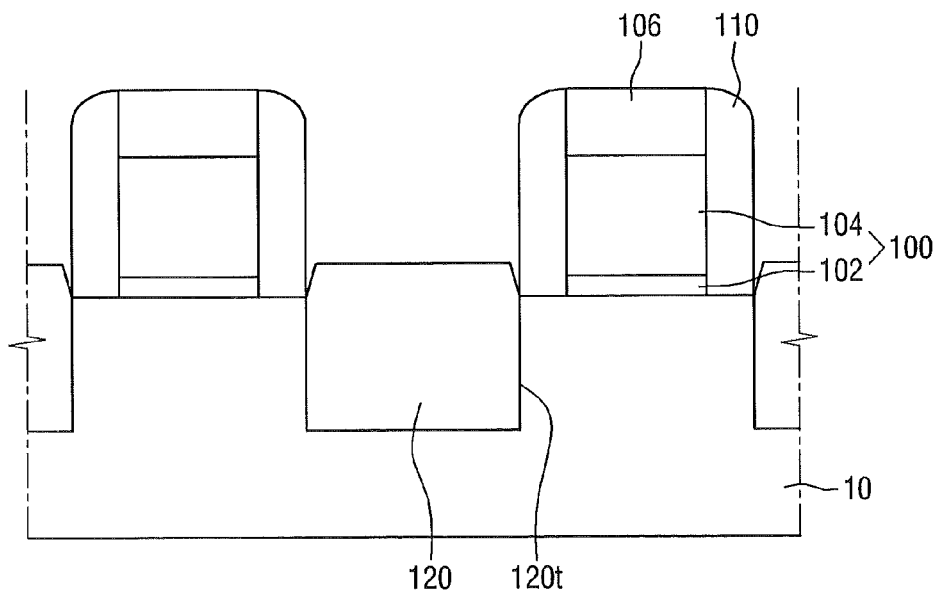

Referring to FIG. 2, a first trench 120t may be formed in the substrate 10 by etching the substrate 10 between the spacers 110 on adjacent gate patterns 100. A semiconductor pattern 120 that protrudes from the substrate 10 and above a top surface of the substrate 10 may be formed in the first trench 120t.

The first trench 120t and the semiconductor pattern 120 may be formed as follows. The substrate 10 may be etched in regions between the dummy gate patterns 100 and spacers 110. The etching of the substrate 10 may be performed by dry or wet etching process. The first trench 120t may have a structure that is curved from an upper surface to a lower surface thereof. The semiconductor pattern 120 is formed in the first trench 120t. The semiconductor pattern 120 may increase compressive or tensile stress that acts on the channel area. In order to increase the tensile or compressive stress acting on the channel area, the cross-section of the first trench 120t may have various shapes. Although FIG. 2 illustrates that the cross-section of the first trench 120t has a box shape, the cross-sectional shape of the first trench 120t is not limited thereto, but may have, for example, a sigma (Σ) shape.

The semiconductor pattern 120 may be formed in the first trench 120t. The semiconductor pattern 120 may be formed to protrude from a boundary surface between the dummy gate pattern 100 and the substrate 10, but is not limited thereto. Tensile or compressive stress may be applied to the channel area by the semiconductor pattern 120, and through this, the performance of the semiconductor device can be improved. The semiconductor pattern 120 may be, for example, a source or a drain of a transistor. The semiconductor pattern 120 may be formed by epitaxially growing a semiconductor material in the first trench 120t. The semiconductor pattern 120 may be a single crystal epitaxial layer. The semiconductor pattern 120 may be formed by, for example, chemical vapor deposition or atomic layer deposition. If the semiconductor pattern 120 is provided to apply tensile or compressive stress to the channel area, the semiconductor pattern 120 may be made of a material having a different lattice constant from the substrate 10, but is not limited thereto. In the case where the semiconductor device is a p-type MOS (PMOS) transistor, it may be preferable to apply compressive stress to the substrate 10. The semiconductor pattern 120 may be formed of a material having a larger lattice constant than the substrate 10. That is, if the substrate 10 is made of silicon (Si), the semiconductor pattern 120 may be formed of silicon germanium (SiGe) that has a larger lattice constant than silicon. In the case where the semiconductor device is an n-type MOS (NMOS) transistor, it may be preferable to apply tensile stress to the substrate 10. The semiconductor pattern 120 may be formed of a material having a smaller lattice constant than the substrate 10. That is, if the substrate 10 is made of silicon (Si), the semiconductor pattern 120 may be formed of silicon carbide (SiC) that has a smaller lattice constant than silicon. In the case where the semiconductor device is an n-type MOS (NMOS) transistor, the semiconductor pattern 120 in the first trench 120t may form a protruded silicon epitaxial film.

Figure 3:
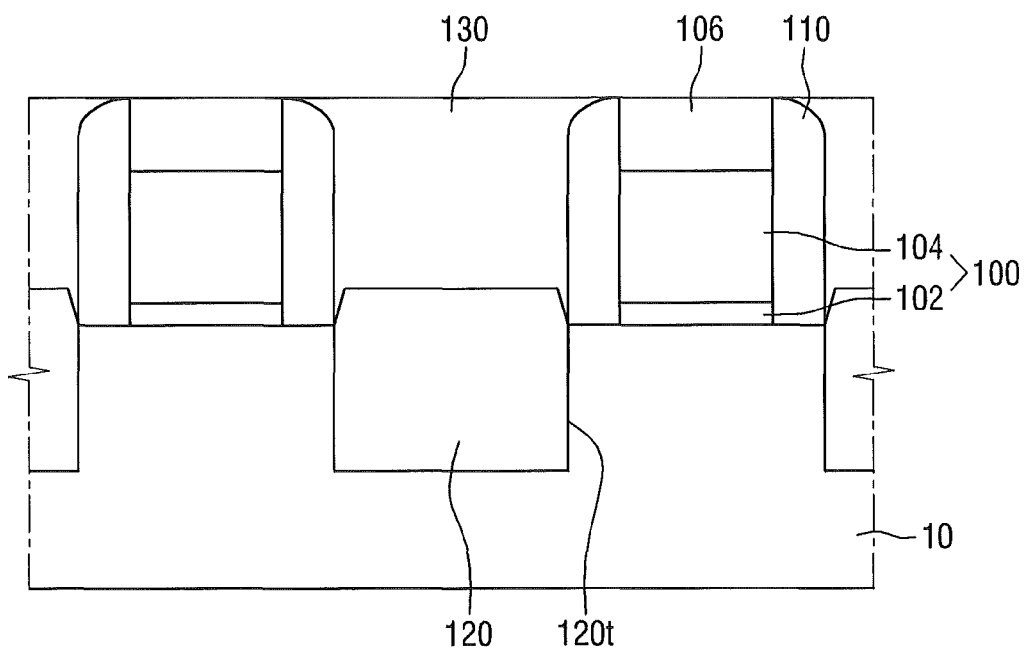
Figure 4:
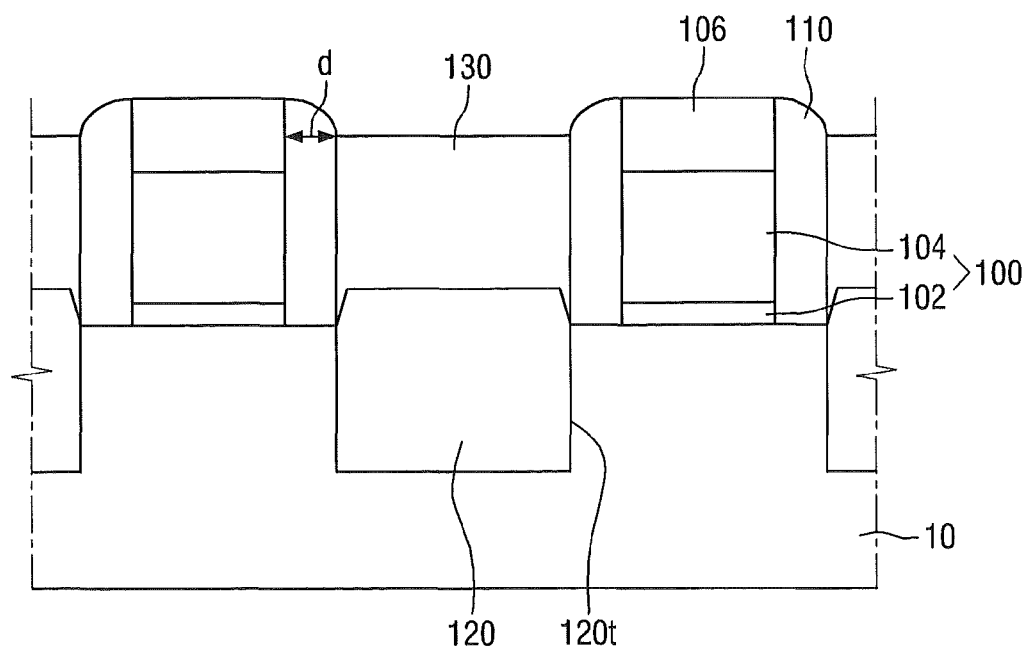

Referring to FIGS. 3 and 4, a first interlayer insulating film 130 may be formed. The insulating film 130 may surround sidewalls of the spacer 110 and may expose upper portions of the spacers 110. The first interlayer insulating film 130 may also expose the gate hard mask 106. The first interlayer insulating film 130 may surround the sidewalls of the spacers 110 except for the upper portions of the spacers 110. The first interlayer insulating film 130 may be made of a material having an etching selection ratio with respect to the spacers 110 and the gate hard mask 106. In the following process, the first interlayer insulating film 130 is etched less than the spacer 110 and the gate hard mask 106.

Referring to FIG. 3, the first interlayer insulating film may be formed as follows. An insulating film that covers the gate hard mask 106 and the spacer 110 may be formed on the substrate 10. Thereafter, the gate hard mask 106 may be exposed by smoothing the insulating film and the first interlayer insulating film 130 may be formed. A low-k material may be used as the first interlayer insulating film 130, and may be, for example, FOX (Flowable Oxide), TOSZ (Tonen SilaZen), USG (Undoped Silica Glass), BSG (BoroSilica Glass), PSG (PhosphoSilica Glass), BPSG (BoroPhosphoSilica Glass), PRTEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof. In an embodiment of the present invention, explanation will be made under the assumption that the spacer 110 and the gate hard mask 106 are made of silicon nitride and the first interlayer insulating film 130 is a silicon oxide film.

Referring to FIG. 4, the height of an upper surface of the first interlayer insulating film 130 may be lowered through an etch back process. After this etch back process, the upper surface of the first interlayer insulating film 130 may have a height that is lower than the upper surface of the gate hard mask 106. After the etch back, the first interlayer insulating film 130 may still surround the sidewalls of the spacers 110 except for the upper portions of the spacers 110. The first interlayer insulating film that is smoothed as shown in FIG. 3 may expose the gate hard mask 106, but may not expose the spacer 110. Further, the width d of the portion of the spacer 110 that meets with the upper surface of the first interlayer insulating film 130 may need to be relatively wide to facilitate an air gap forming process that is performed after the spacer 110 is removed. If the width d of the portion of the spacer 110 that adjoins the upper surface of the first interlayer insulating film 130 is too narrow, the air gap may be filled with other material in the subsequent process.

Figure 5:
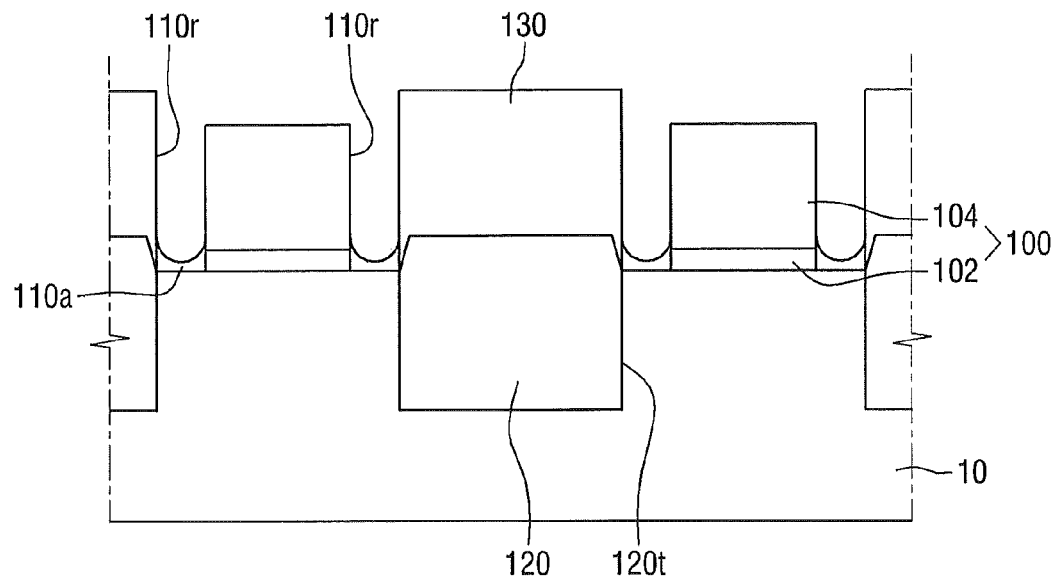

Referring to FIGS. 4 and 5, a first recess 110r may be formed by removing the spacer 110 and the gate hard mask 106. The first recess 110r may be surrounded by the first interlayer insulating film 130 and the dummy gate pattern 100. That is, space is formed on both sides of the dummy gate pattern 100.

When the spacer 110 and the gate hard mask 106 are removed, a lower part 110a of the spacer may remain on the substrate 10. The lower surface of the first recess 110r may be formed by the part 110a of the spacer. However, if the spacer 110 is removed completely, the lower surface of the first recess 110r may be the exposed substrate 10. If the spacer 110 is removed completely, the substrate 10 may be damaged during the spacer removal process. If the substrate 10 is damaged, this may exert an influence on the channel area, which may negatively impact the reliability of the semiconductor device. Accordingly, the part 110a of the spacer may be left on the substrate 10 in some embodiments.

The removal of the spacer 110 and the gate hard mask 106 may be performed using, for example, wet etching, dry etching, or a combination thereof. The etchant used in the wet etching or the etching gas used in the dry etching may be a material that has etching selectivity with respect to the spacer 110 and the gate hard mask 106. That is, the first interlayer insulating film 130 may be an etching-resistant material with respect to an etching material that is used to remove the spacer 110 and the gate hard mask 106. This facilitates selectively removing the spacer 110 and the gate hard mask 106 by etching in order to form the first recess 110r on a portion where the spacer 110 was deposited.

Figure 6:
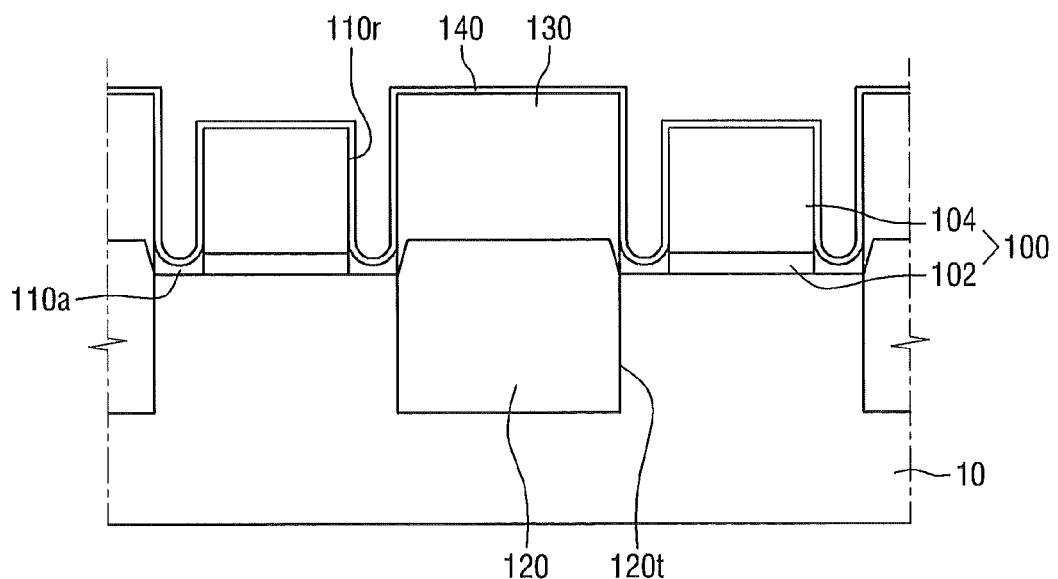

Referring to FIG. 6, a liner 140 that conformally covers the first recess 110r may be formed. The liner 140 may be formed on not only the first recess 110r but also the upper surface of the first interlayer insulating film 130. However, in the case of using a mask pattern (not illustrated), the liner 140 may be formed only on the inside of the first recess 110r. A portion of the liner 140 that covers the first recess 110r, which is formed on the side surface of the dummy gate pattern 100, may serve as a supporter to form a metal gate, specifically, as a sidewall, in the following process. After the liner 140 that conformally covers the first recess 110r is formed, the width of the inner space of the first recess 110r may be reduced, but an air gap still remains therein.

The liner 140 may include, for example, low-k SiOCN, low-k SiBN, low-k SiBCN, SiN, and a combination thereof. However, in consideration of the following fabrication process, it is sufficient if the liner 140 is made of a material having an etching selection ratio with respect to the interlayer insulating films and the films that form the dummy gate pattern, and thus the materials of the liner 140 are not limited thereto. The liner 140 may have a uniform thickness, and may be formed using, for example, atomic layer deposition. Specifically, in the case where the liner 140 is a low-k SiBN, a method for forming the low-k SiBN by atomic layer deposition will be described. First, using an organic precursor including dichlorosilane ($SiH_2Cl_2$), silane ($SiH_4$), disilane ($Si_2H_6$), or Si, a first silicon film that covers the first recess 110r is formed. Thereafter, the silicon precursor is purged, and using boron precursor, for example, diborane ($B_2H_6$), a boron film is formed on the first silicon film. The boron precursor is purged, and using the silicon precursor, a second silicon film is formed on the boron film. Thereafter, the silicon precursor is purged, and using nitride precursor, for example, ammonia ($NH_3$), a nitride film is formed on the second silicon film. By repeating the above-described proves, the liner 140 having a target width can be formed. Even in the case where the liner 140 is low-k SiOCN or SiN, the liner 140 may be formed through a repeated deposition process of low-k SiBN.

Figure 7:
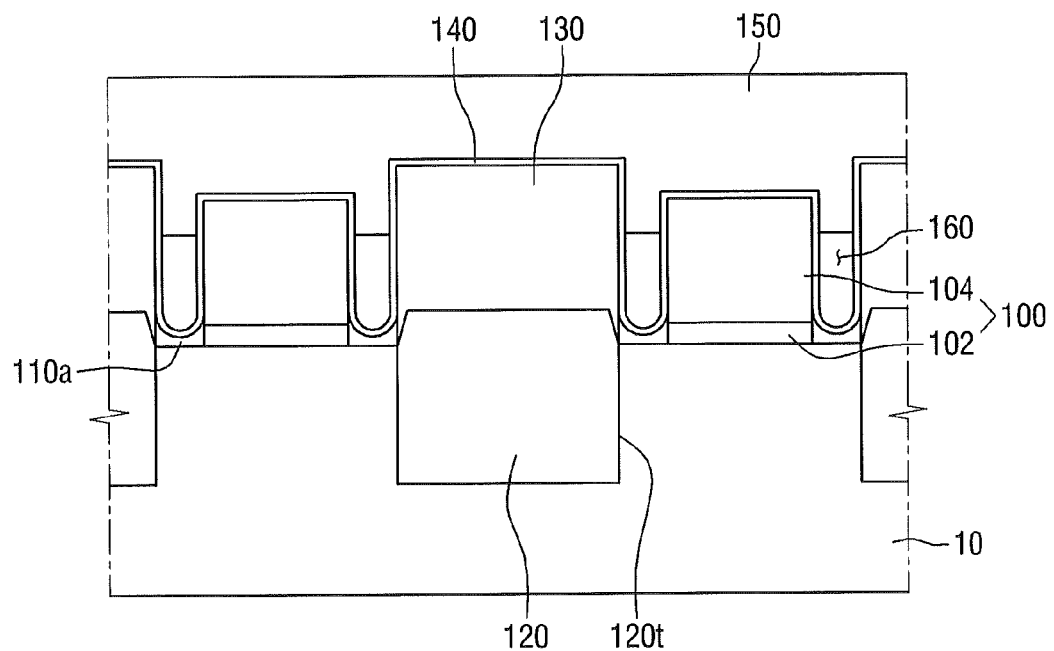

Referring to FIG. 7, a blocking film 150 that covers the first recess 110r, the liner 140, the dummy gate pattern 100, and the first interlay insulating film 130 may be formed. A part of the blocking film 150 is formed inside the first recess 110r to fill up the upper portion of the first recess 110r. The blocking film 150 may cover the first recess 110r to form an air gap 160. The air gap 160 may be formed on both sides of the dummy gate pattern 100. That is, a low-k hybrid spacer that is composed of the air gap 160 and the liner 140 may be formed. The air gap 160 may be formed to be surrounded by the liner 140 and the blocking film 150.

The blocking film 150, may include, for example, low-k SiOCN, low-k SiBN, low-k SiBCN, SiON, and a combination thereof, but is not limited thereto. In consideration of the following fabricating process, the liner 140 may be made of a material having an etching selection ratio with respect to the interlayer insulating films and the films that form the dummy gate pattern. The blocking film 150 and the liner 140 may be made of, for example, the same material, but are not limited thereto. The blocking film 150 may be formed using, for example, chemical vapor deposition, which may provide substantially good step coverage. The chemical vapor deposition that is used to form the blocking film 150 may be used, for example, in a process in which the step coverage is greater than or equal to 75%. If the step coverage is increased further, the blocking film 150 can be conformally formed along the liner 140. In this case, all or almost all of the first recess 110r may be filled, and thus the air gap 160 may not be formed or may be very small.

Figure 8:
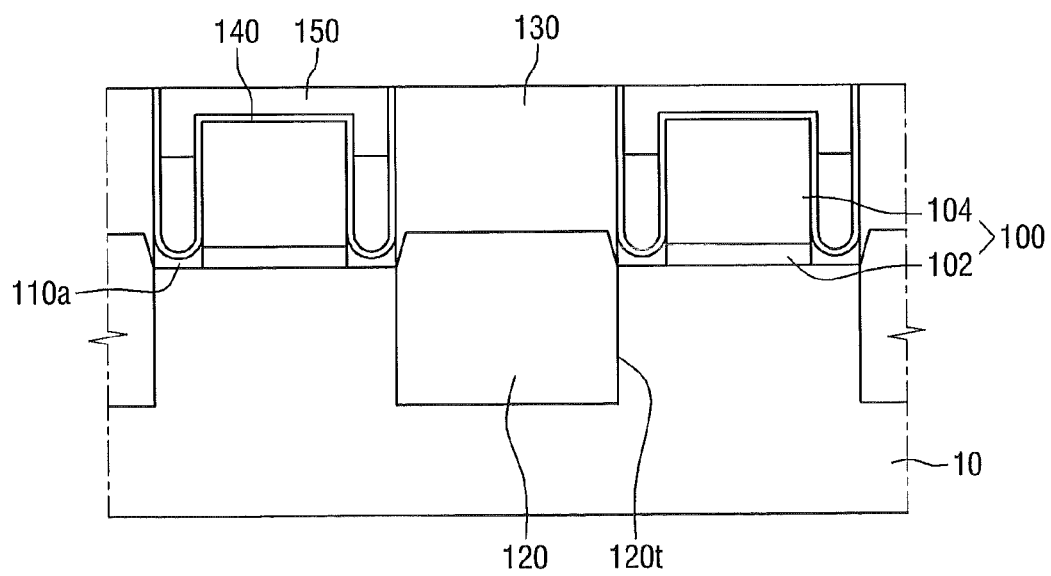

Referring to FIG. 8, by smoothing the blocking film 150, the first interlayer insulating film 130 may be exposed. The blocking film 150 that is formed on the dummy gate pattern 100 and the air gap 160 may be, for example, in the form of a rotated "⊏" shape. However, the shape of the blocking film 150 is not limited thereto since the cross-sectional shape of the blocking film 150 may differ, for example, depending upon the relative heights of the upper surface of the dummy gate pattern 100 and the upper surface of the first interlayer insulating film 130.

Figure 9:
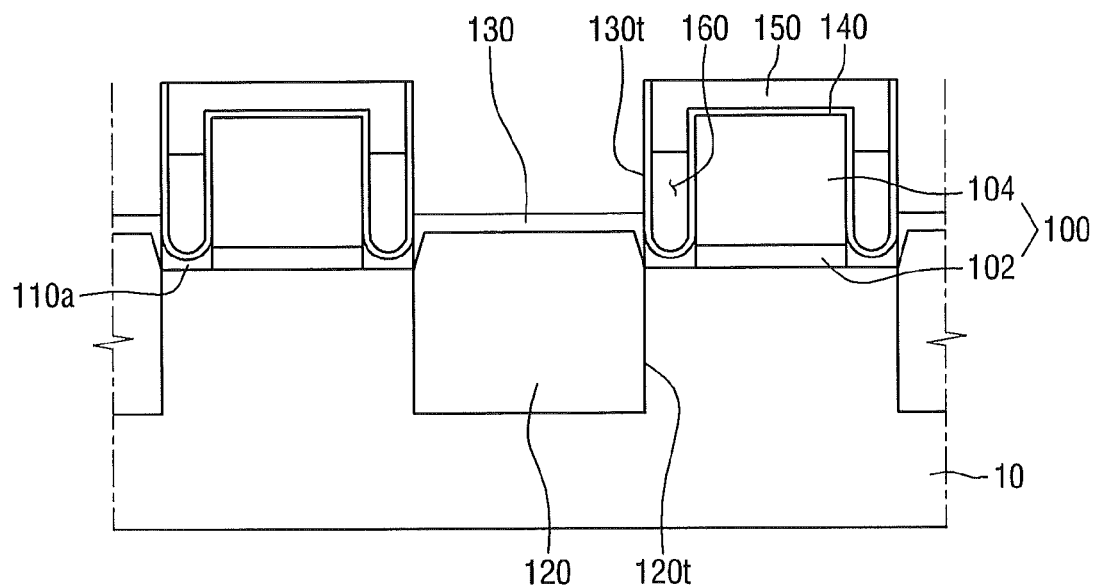

Referring to FIG. 9, by removing an upper part of the first interlayer insulating film 130, a second trench 130t may be formed. A bottom surface of the second trench 130t may be the upper surface of the first interlayer insulating film 130 that remains, and side surfaces of the second trench 130 may be the liner 140. In other embodiments (not pictured), the semiconductor pattern 120 may be exposed by the second trench 130t.

Figure 10:
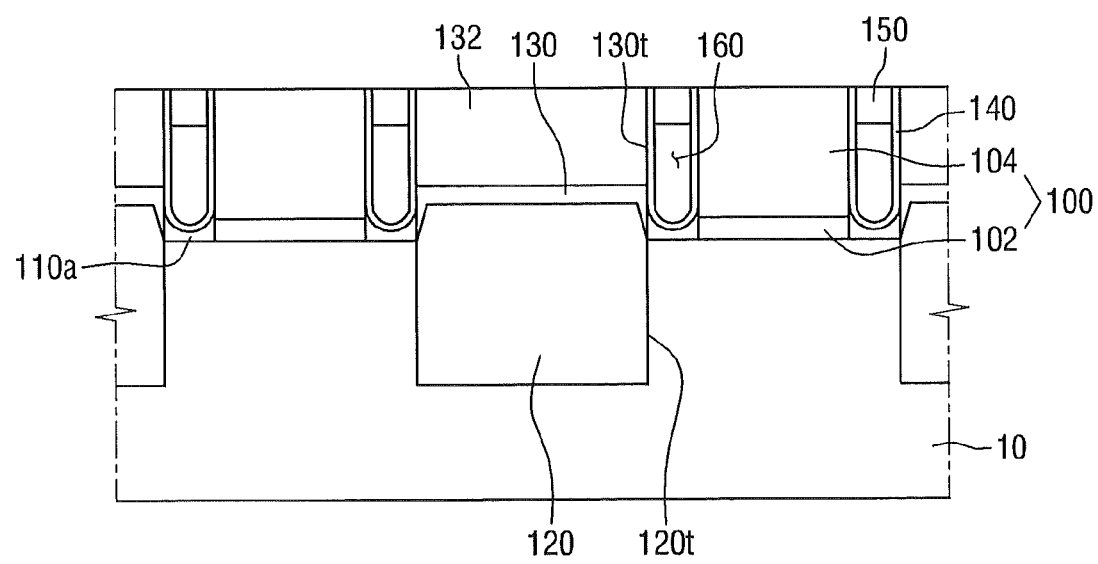

Referring to FIG. 10, an insulating film that fills up the second trench 130t may be formed on the substrate 10. Through smoothing the insulating film, the dummy gate pattern 100 may be exposed and the second interlayer insulating film 132 may be formed. The second interlayer insulating film 132 may be made of a low-k material, and for example, may be made of FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PRTEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof.

Figure 11:
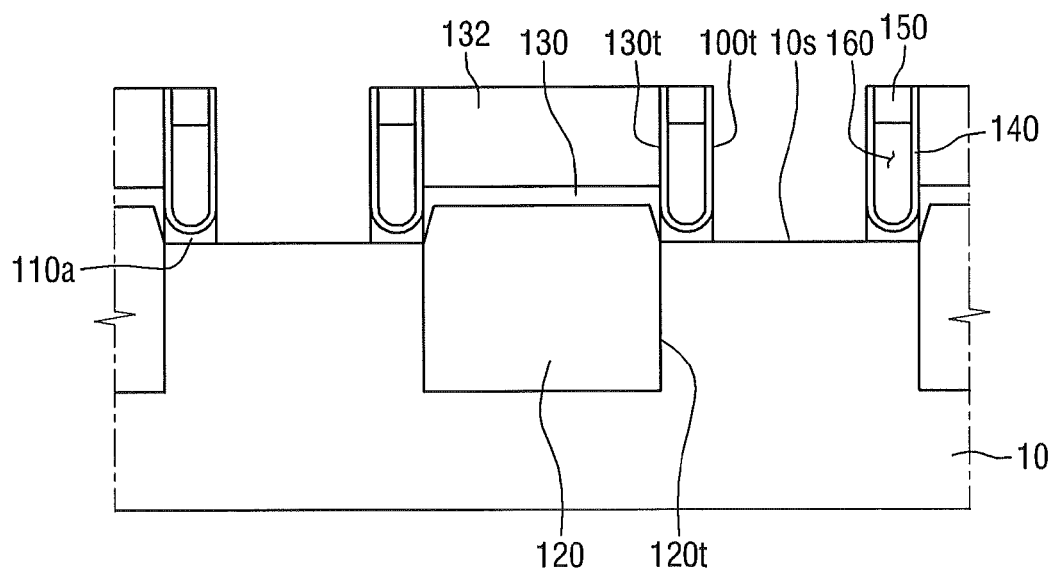

Referring to FIG. 11, by etching the exposed dummy gate pattern 100, a third trench 100t may be formed. The third trench 100t may expose the upper surface of the substrate 10. A sidewall of the third trench 100t may be the liner 140. If the spacer has not been completely removed in the process of FIG. 5, a lower portion of the sidewall of the third trench 100t may be a part 110a of the spacer.

If the dummy gate electrode 104 is made of silicon, an etching process for removing the dummy gate electrode 104 may be, but is not limited to, a wet etching process using TMAH (Tetramethyl Ammonium Hydroxide) and/or TEAH (Tetraethylammonium Hydroxide). After removing the dummy gate electrode 104, the exposed dummy gate insulating film 102 may also be removed through an etching process. The dummy gate insulating film 102 may be removed by wet etching, dry etching, and a combination thereof. The etching solution or etching gas may differ depending on, for example, the material of the dummy gate insulating film 102.

Figure 12:
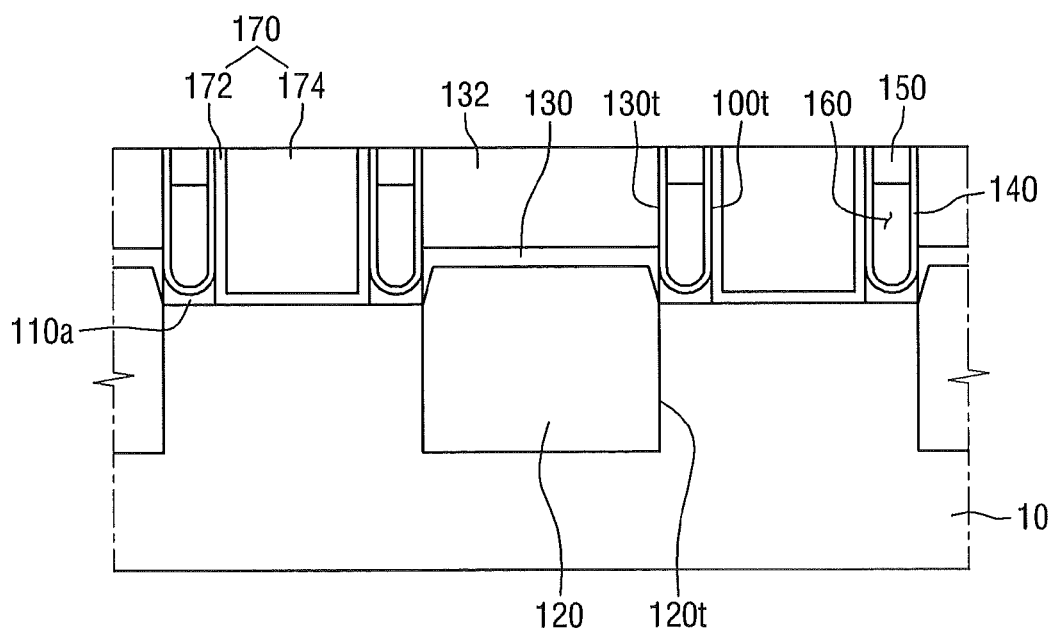

Referring to FIG. 12, a gate insulating film 172 and a metal gate electrode 174 may be formed in the third trench 100t. The gate insulating film 172 may include a high-k insulating film. Between the gate insulating film 172 and the substrate 10, a gate silicon oxide film (not illustrated) that is grown by a chemical method may further be included. The gate silicon oxide film that is conformally formed on the substrate 10 may serve as a boundary film between the substrate 10 and the gate insulating film 172. The gate insulating film 172 may be conformally formed, for example, along the third trench 100t, and specifically, may have a cross-sectional shape of a cup. The metal gate electrode 174 may be formed on the gate insulating film 172. The gate pattern 170 may be formed by sequentially forming the gate insulating film 172 and the metal gate electrode 174.

The gate silicon oxide film may be formed, for example, by treating the substrate 10 with a chemical material. Specifically, by treating the substrate 10 with a solution including oxygen raw material and ammonia (NH3), a predetermined area of the substrate 10 may be oxidized by the oxygen raw material to form a gate silicon oxide film. Hydrogen peroxide may be used as the oxygen raw material, but is not limited thereto.

The gate insulating film 172 may include a high-k insulating film, and for example, may include, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate insulating film 172 may be formed using, for example, chemical vapor deposition, physical vapor deposition (PVD), or atomic layer deposition.

In FIG. 12, the metal gate electrode 174 is illustrated as a single layer, but is not limited thereto. The metal gate electrode 174 may be formed as a single layer or a multilayer including hafnium (Hf), zirconium (Zr), titanium (Ti), tantalum (Ta), aluminum (Al), tungsten (W), and a combination thereof. For example, the metal gate electrode 174 may have a five-layer film structure of TiN—TaN—TiAl—TiN—Ti/Al. The metal gate electrode may be formed using, for example, chemical vapor deposition, physical vapor deposition, or atomic layer deposition.

On the lower portion of both sides of the gate pattern 170 that includes the metal gate electrode 174 and the gate insulating film 172, a hybrid spacer that is composed of the air gap 160 and the liner 140 is provided. Since the hybrid spacer has a double structure including the air gap 160 having dielectric constant of "1" and the liner 140 having relatively low dielectric constant, the hybrid spacer may have lower dielectric constant than the liner 140. Accordingly, in a transistor in which the hybrid spacer is formed, capacitive coupling between a gate and a source and/or drain may be decreased and the operational characteristic of the transistor may be improved.

Referring to FIGS. 13 to 19, a method for fabricating a semiconductor device according to another embodiment of the invention will be described. Since a process for forming a liner according to this embodiment is the same as the fabricating process illustrated in FIGS. 1 to 6 according to the previous embodiment, the explanation thereof will be simplified or omitted. Further, since a process after forming the air gap spacer is substantially the same as that according to the above-described embodiment, the explanation thereof will be simplified or omitted.

Figure 13:
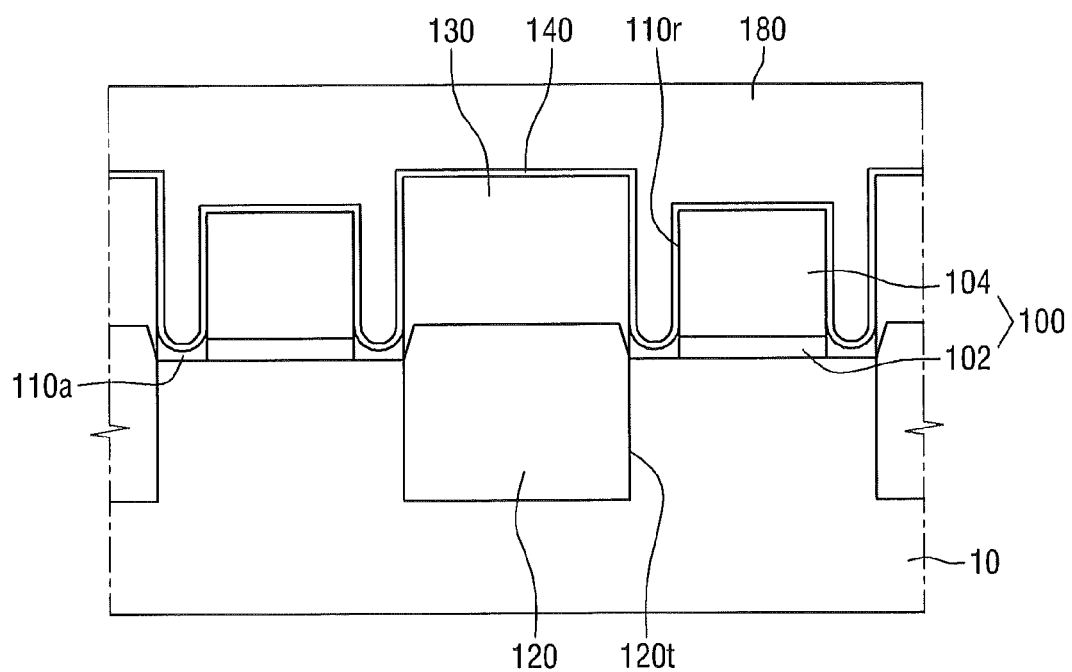
FIGS. 13 to 19 are views explaining intermediate steps of a method for fabricating a semiconductor device according to another embodiment of the present invention.

Referring to FIG. 13, the dummy gate pattern 100, the liner 140, the first interlayer insulating film 130 and the first recess 110r may be formed on the substrate 10. A filler 180 may be inserted into the first recess 110r and may fill up the first recess 110r completely.

Since the size of the semiconductor device is reduced, the width of the spacer that is formed on both sides of the gate pattern is also reduced. The width of the first recess 110r that is formed after removing the spacer is also narrowed. Since the liner 140 is formed in the first recess 110r, the width of the inside of the first recess 110r is further reduced. Accordingly, the filler 180 may comprise a material that has good gap-filling characteristics such as, for example, SOH, so that the the filler 180 may mostly or completely fill the first recess 110r on which the liner 140 is formed.

Figure 14:
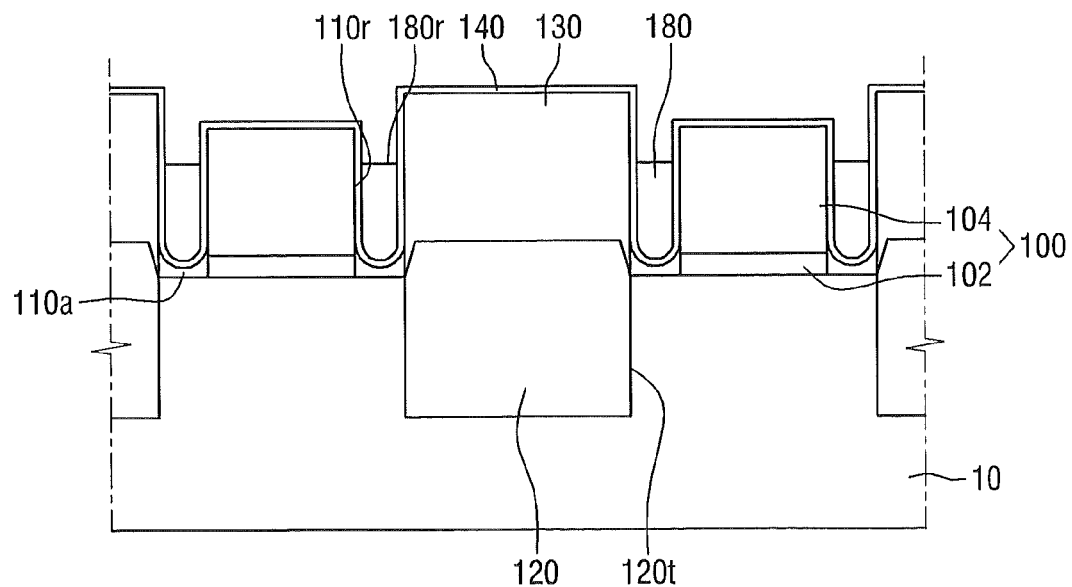

Referring to FIG. 14, the filler 180 on the dummy gate pattern 100 and the first interlayer insulating film 130 may be partially removed through etch back. Further, by removing a part of the filler 180 that fills the first recess 110r, a second recess 180r may be formed. The second recess 180r may be surrounded by the filler 180 and by the liner 140 that is on the upper portion of the dummy gate pattern 100 and on the upper portion of the first interlayer insulating film 130.

Figure 15:
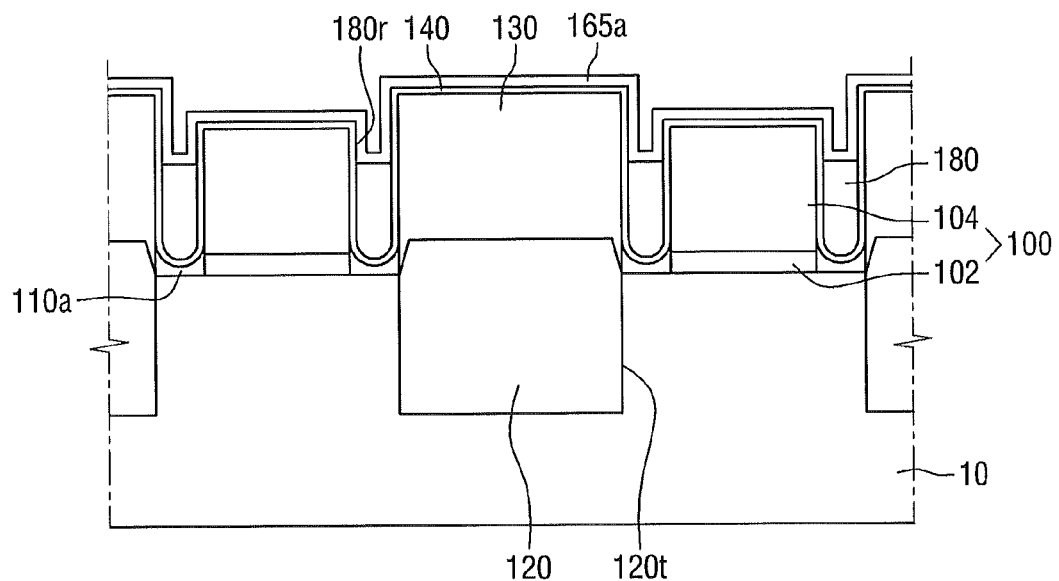

Referring to FIG. 15, an air gap spacer film 165a that covers the second recess 180r, the dummy gate pattern 100, and the first interlayer insulting film 130 may be formed. The portions of the air gap spacer film 165a that cover the opposed sidewalls of the second recess 180r may be formed to be spaced apart from each other. That is, by the air gap spacer film 165a, the upper portion of the second recess 180r can be prevented from being clogged.

The air gap spacer film 165a may include an oxide or nitride, but is not limited thereto. The air gap spacer film 165a may be formed on the second recess 180r, the dummy gate pattern 100, and the first interlayer insulating film via, for example, atomic layer deposition, and may have a uniform thickness.

Figure 16:
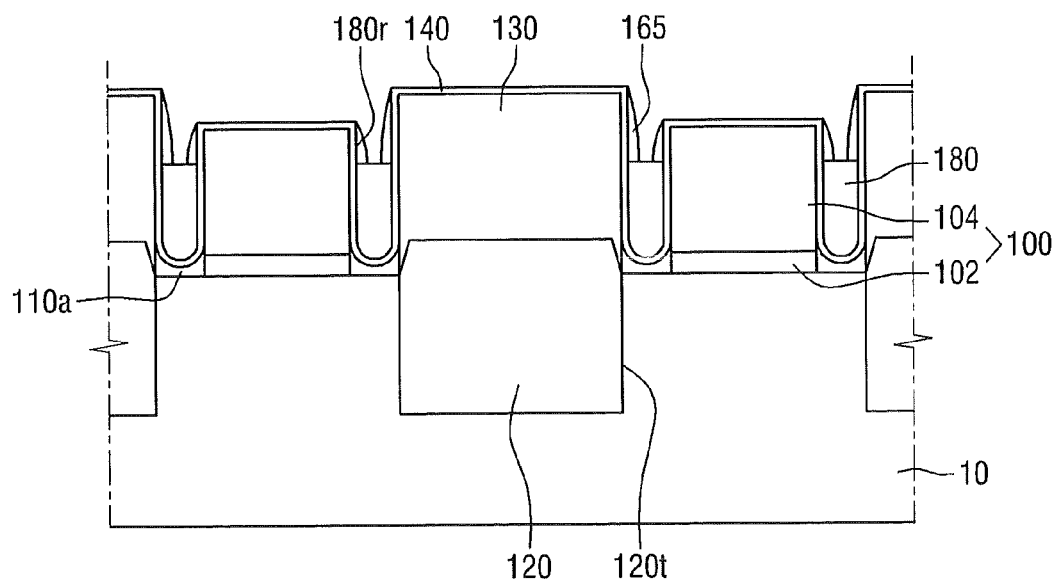

Referring to FIG. 16, by etching the air gap spacer film 165a, air gap spacers 165 may be formed on the sidewalls of the second recess 180r. The air gap spacers 165 may be formed on an upper side surface of the dummy gate pattern 100 and an upper side surface of the first interlayer insulating film 130. The air gap spacers 165 are formed on the filler 180, but do not completely cover the filler 180. That is, the air gap spacers 165 formed on the upper side surface of the dummy gate pattern 100 and the upper side surface of the first interlayer insulating film 130 are spaced apart from each other, and thus do not completely cover the filler 180.

The air gap spacers 165 that are formed on the upper side surface of the dummy gate pattern 100 and the upper side surface of the first interlayer insulating film 130 may have different heights, as shown in FIG. 16. The different heights of the air gap spacers 165 are caused by the different heights of the upper surface of the dummy gate pattern 100 and the upper surface of the first interlayer insulating film 130, but are not limited thereto.

Figure 17:
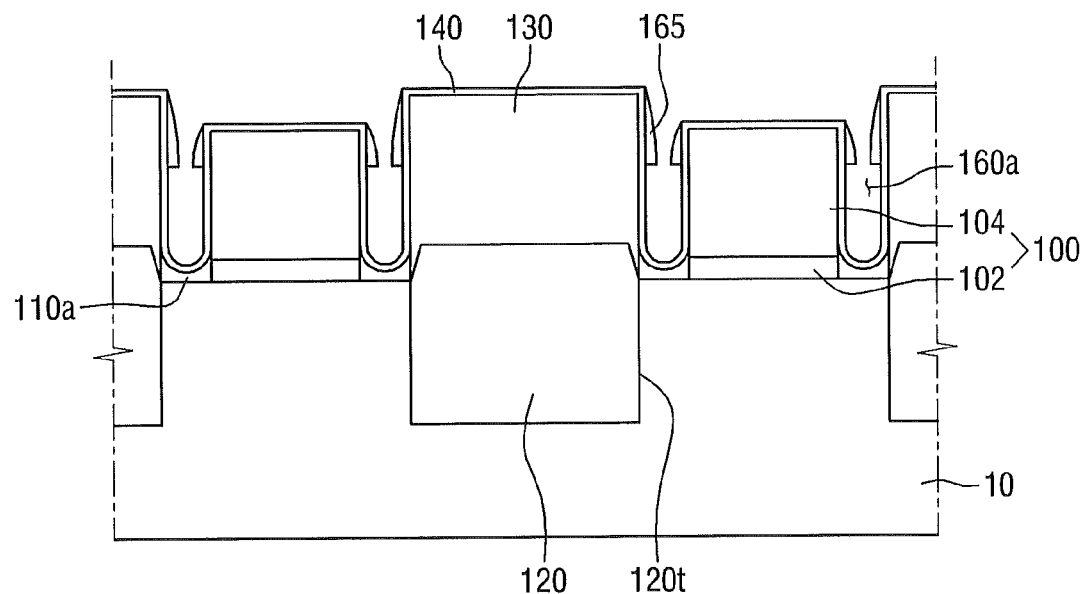

Referring to FIG. 17, the filler 180 that is underneath the air gap spacer 165 may be removed. The filler 180 may be removed by, for example, an ashing process. Since the filler 180 is exposed between the air gap spacers 165 formed on the upper side surface of the dummy gate pattern 100 and the upper side surface of the first insulating film 130, the filler 180 on the lower portion of the air gap spacer 165 can be removed using the exposed area.

Figure 18:
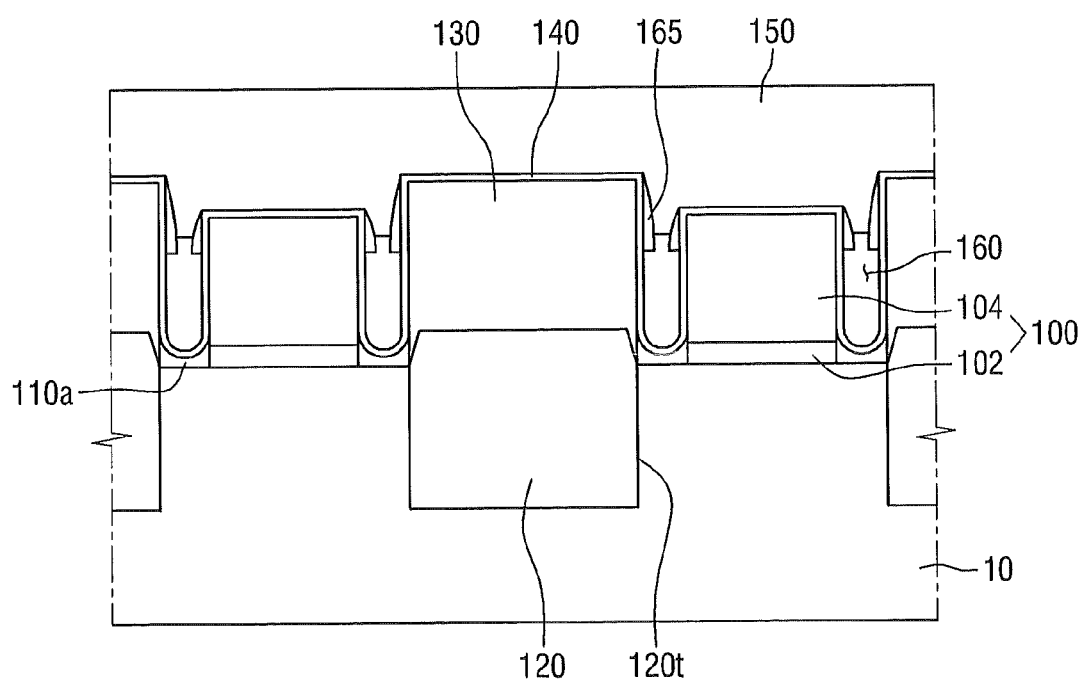

Referring to FIG. 18, the blocking film 150 may be formed on the air gap spacer 165, the dummy gate pattern 100, and the first interlayer insulating film 130. By forming the blocking film 150, an air gap 160 may be formed on both sides of the dummy gate pattern 100. A part of the blocking film 150 may be inserted between the air gap spacers 165, and the upper portion of the air gap spacer 165 may be filled. The blocking film 150 may include an insertion film (not illustrated) that is conformally formed on the air gap spacer 165, the dummy gate pattern 100, and the first interlayer insulating film 130.

The insertion film may be formed on the air gap spacer 165, the dummy gate pattern 100, and the first interlayer insulating film 130 with a uniform thickness, and may be formed even in a narrow space between the air gap spacers 165. Since the insertion film fills up the narrow space between the air gap spacers 165, it may serve to prevent the air gap 160 from being opened in the following process. The insertion film may be made of, for example, the same material as the liner 140. Specifically, the insertion film may include low-k SiOCN, low-k SiBN, SiN, or a combination thereof. The insertion film may be formed using, for example, an atomic layer deposition method having good step coverage. If the growing speed of the blocking film 150 is lowered and a part of the blocking film 150 fills up the narrow space between the air gap spacers 165, the insertion film may not be formed.

The blocking film 150 may include, for example, low-k SiOCN, low-k SiBN, SiN, or a combination thereof, but is not limited thereto. The blocking film 150 and the liner 140 may be made of, for example, the same material, but is not limited thereto. The blocking film 150 may be formed using, for example, chemical vapor deposition. As the chemical vapor deposition that is used to form the blocking film 150, for example, a process having a step coverage of 75% or less may be used.

Figure 19:
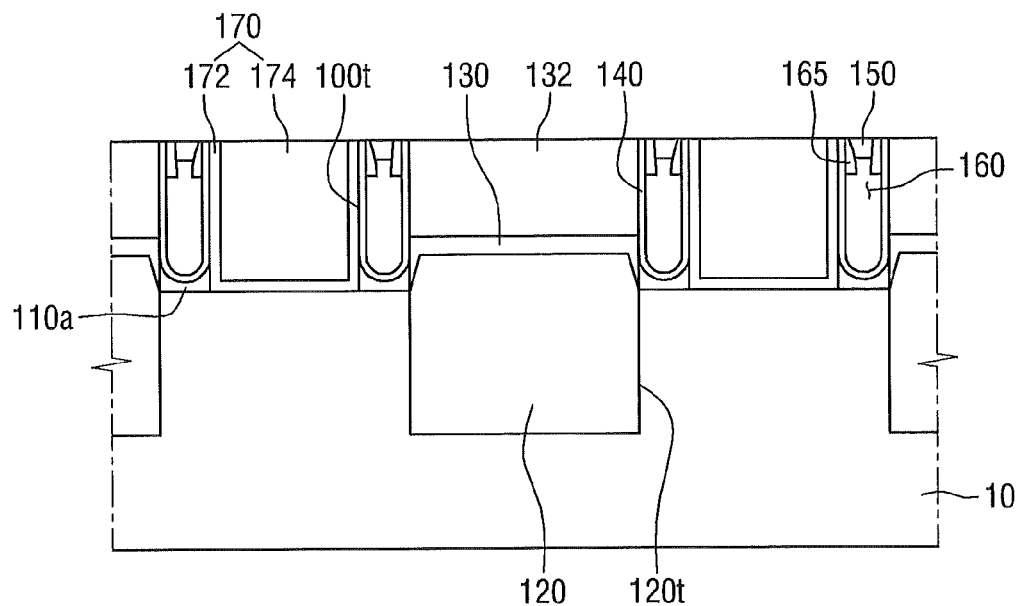

Referring to FIG. 19, by smoothing the blocking film 150, the first interlayer insulating film 130 may be exposed and an upper portion of the exposed first interlayer insulating film 130 may then be removed. The second interlayer insulating film 132 may be formed in the recess that is created when the upper portion of the first interlayer insulating film 130 is removed. When the second interlayer insulating film 132 is formed, the dummy gate pattern 100 may be exposed. By removing the exposed dummy gate pattern, the third trench 100t may be formed. The gate pattern 170 may be formed by forming the gate insulating film 172 and the metal gate electrode 174 in the third trench 100t.

Figure 20:
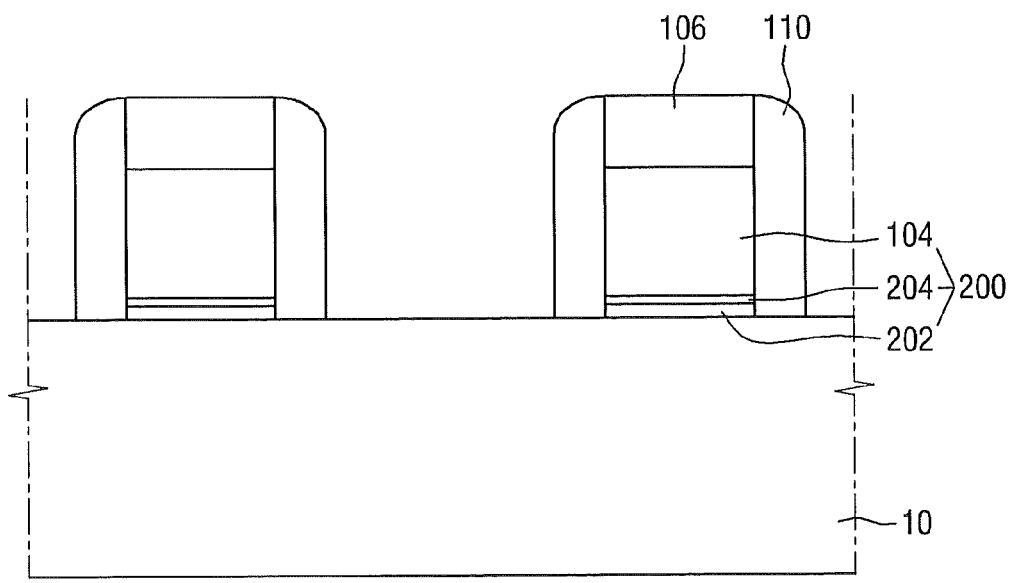
FIGS. 20 to 22 are views explaining intermediate steps of a method for fabricating a semiconductor device according to still another embodiment of the present invention.
Figure 21:
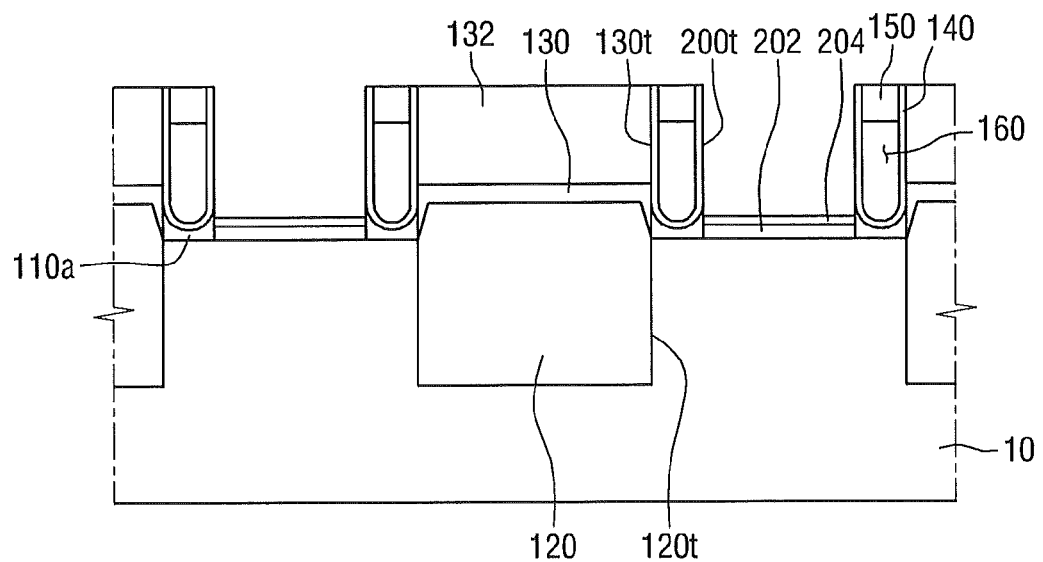
Figure 22:
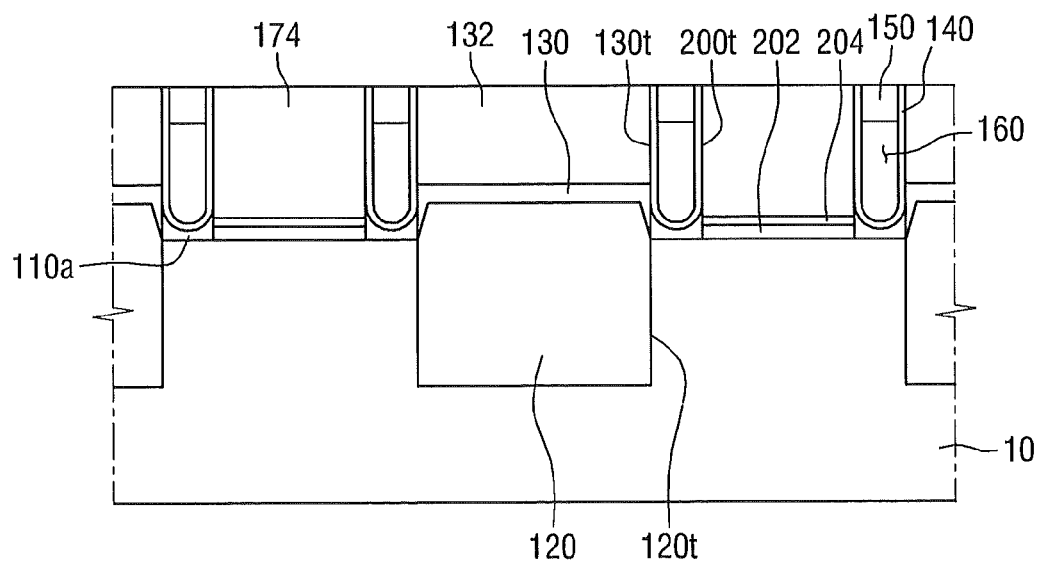

Referring to FIGS. 20 to 22, a method for fabricating a semiconductor device according to still another embodiment of the invention will be described. This embodiment is substantially the same as the embodiment as described above with reference to FIGS. 1 to 12 except for a process of forming a gate insulating film that includes a high-k insulating film.

Referring to FIG. 20, a dummy gate pattern 200, in which the high-k gate insulating film 202 and the dummy gate electrode 104 are sequentially formed, may be formed on the substrate 10. The gate hard mask 106 may be further formed on the dummy gate pattern 200. The spacer 110 is formed on the sidewall of the dummy gate pattern 200. Between the high-k gate insulating film 202 and the dummy gate electrode 104, a barrier pattern 204 may further be formed.

The dummy gate pattern 200 may be formed by sequentially forming a high-k film, a barrier film, a dummy electrode film, and a hard mask film on the substrate 10. A mask pattern (not illustrated) for forming the dummy gate pattern 200 may be formed on the hard mask film. By performing etching using the mask pattern as a mask, the dummy gate pattern 200 and the gate hard mask 106 may be formed on the substrate 10. Then, the spacer 110 may be formed on sidewalls of the dummy gate pattern 200 and the gate hard mask 106.

A boundary film (not illustrated) may be formed between the high-k gate insulating film 202 and the substrate 10. The boundary film may serve to prevent deterioration of the quality of the high-k gate insulating film 202 due to the difference in permittivity between the substrate 10 and the high-k gate insulating film 202. The boundary film may include, for example, silicon oxide, silicon nitride, or a combination thereof.

The high-k gate insulating film 202 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The barrier pattern 204 may include, for example, at least one of titanium nitride (TiN), tantalum nitride (TaN), and a combination thereof. The barrier pattern 204 may serve to protect the high-k gate insulating film 202 in the following procedure.

The dummy gate electrode 104 may be made of, for example, silicon, and specifically, polycrystalline silicon (poly Si), amorphous silicon (a-Si), and a combination thereof. In the fabricating process to be described hereinafter, since the gate hard mask 106 and the spacer 110 are simultaneously etched and removed, the gate hard mask 106 and the spacer 110 may be made of the same material or materials that are etched by the same gas or etchant. Further, when the gate hard mask 106 and the spacer 110 are removed, it is necessary to have an etching selection ratio with respect to neighboring films, for example, interlayer insulation film and the like. The gate hard mask 106 and the spacer 110 may be made of, for example, silicon nitride.

The following fabricating process will be briefly described with reference to FIGS. 2 to 10. The first interlayer insulating film 130 that covers the dummy gate pattern 200 is formed. The first interlayer insulating film 130 exposes the upper portion of the spacer 110 and the gate hard mask 105. By removing the exposed spacer 110 and the hard mask 106, the first recess 110r may be formed. The spacer 110 may not be removed completely so that a part 110a of the spacer may remain on the substrate 10. By leaving the part 110a of the spacer on the substrate 10, the substrate 10 and the high-k gate insulating film 202 may be protected from damage during the process of removing the spacer 110 (in FIGS. 2-10 the high-k gate insulating film would be in place of the gate insulating film 102). The air gap 160 may be formed by forming the liner 140 on the first recess 110r and blocking the upper portion of the first recess 110r by the blocking film 150. That is, a low-k hybrid spacer that is composed of the air gap 160 and the liner 140 may be formed.

Referring to FIG. 21, the dummy gate electrode 104 may be removed, and a fourth trench 200t may be formed. The liner 140 may be exposed and may form the side surfaces of the fourth trench 200t, and the barrier pattern 204 may be exposed and may form the bottom surface of the fourth trench 200t. The barrier pattern 204 may protect the high-k gate insulating film 202 during the process of removing the dummy gate electrode 104.

Referring to FIG. 22, a metal gate electrode 174 may be formed by filling the fourth trench 200t with a metal film. The metal gate electrode 174 is illustrated as a single layer, but is not limited thereto. The metal gate electrode 174 may be formed of a single layer or a multilayer including, for example, hafnium (HF), zirconium (Zr), titanium (Ti), tantalum (Ta), aluminum (Al), and their alloys.

Still referring to FIG. 23, a method for fabricating a semiconductor device according to yet another embodiment of the invention will be described. This embodiment is substantially the same as the embodiment as described above except that the air gap spacers 165 are formed on the upper sidewall of the metal gate electrode 174 and the upper sidewall of the second interlayer insulating film 132.

Figure 23:
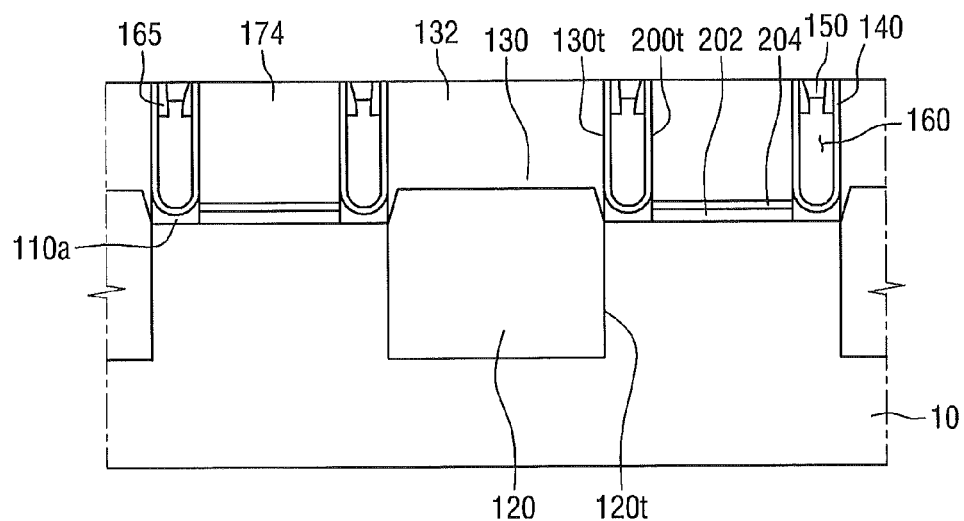
FIG. 23 is a view explaining a method for fabricating a semiconductor device according to yet another embodiment of the present invention.

Referring to FIG. 23, the liner 140 may be formed on the part 110a of the spacer. The air gap spacers 165 may be formed on the upper portion of the liner 140. That is, the air gap spacers 165 may be formed on the upper portion of the metal gate electrode 174 and the upper portion of the second interlayer insulating film 132. The air gap spacers 165, which are spaced apart from each other, may be connected together by the blocking film 150. Accordingly, the air gap 160 that is surrounded by the liner 140, the air gap spacers 165, and the blocking film 150 may be formed. The air gap 160 may be an air layer that is sealed up to be separated from the outside. One side of the air gap 160 may be adjacent the metal gate electrode 174 and the other side thereof may be adjacent the first and second interlayer insulating films 130 and 132.

Figure 24:
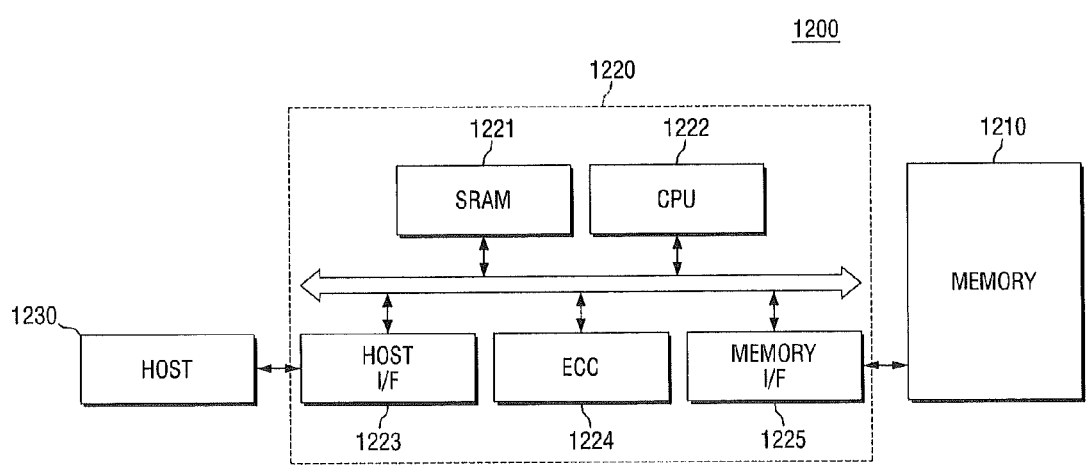
FIG. 24 is a block diagram illustrating the configuration of a memory card that includes a semiconductor device fabricated according to an embodiment of the present invention.

FIG. 24 is a block diagram illustrating the configuration of a memory card that includes the semiconductor device fabricated by the method for fabricating the semiconductor device according to the embodiments of the present invention.

Referring to FIG. 24, a memory 1210 that includes the semiconductor device fabricated according to various embodiments of the present invention may be adopted in a memory card 1200. The memory card 1200 may include a memory controller 1220 that controls data exchange between a host 1230 and the memory 1210. An SRAM 1221 may be used as an operating memory of a central processing unit 1222. A host interface 1223 may include a protocol for the host 1230 to connect to the memory card 1200 for the data exchange. An error correction circuit 1224 may detect and correct errors in the data read from the memory 1210. A memory interface 1225 may interface with the memory 1210. The central processing unit 1222 may perform the overall control operation that is related to the data exchange with the memory controller 1220.

Figure 25:
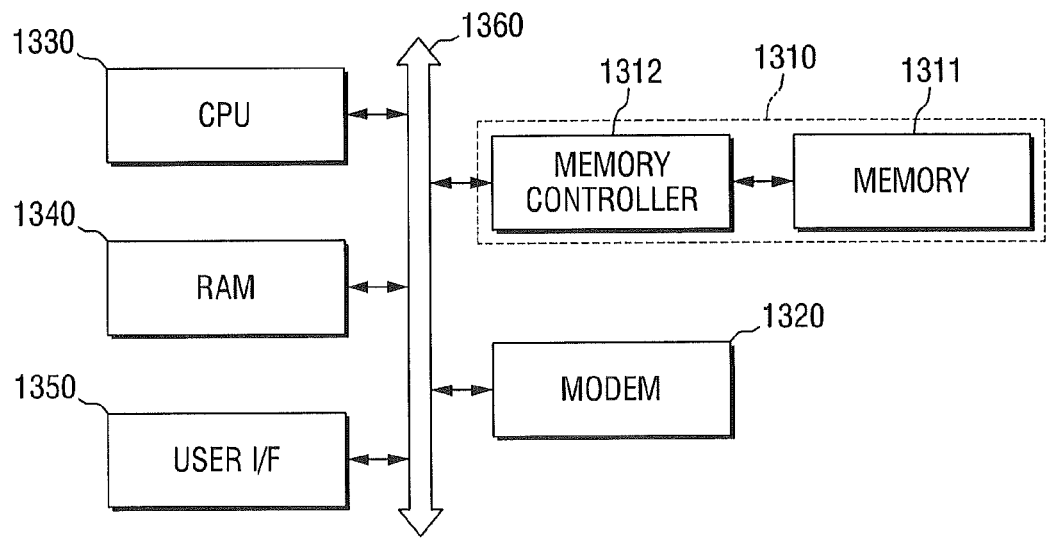
FIG. 25 is a block diagram illustrating the configuration of an information processing system using a semiconductor device fabricated according to an embodiment of the present invention.

FIG. 25 is a block diagram illustrating the configuration of an information processing system using the semiconductor device fabricated by the method for fabricating the semiconductor device according to the embodiments of the present invention.

Referring to FIG. 25, an information processing system 1300 may include a memory system 1310 that includes the semiconductor device fabricated according to various embodiments of the present invention. The information processing system 1300 may include the memory system 1310, a modem 1320, a central processing unit 1330, a RAM 1340, and a user interface 1350, which are electrically connected to a system bus 1360. The memory system 1310 may include a memory 1311 and a memory controller 1312, and may have substantially the same configuration as the memory card 1200 illustrated in FIG. 25. Data that is processed by the central processing unit 1330 and data that is received from an external device may be stored in the memory system 1310. The information processing system 1300 may be applied to a memory card, an SSD, a camera image sensor, and other various chip sets. For example, the memory system 1310 may be configured to adopt the SSD, and in this case, the information processing system 1300 may stably and reliably process large-capacity data.

Figure 26:
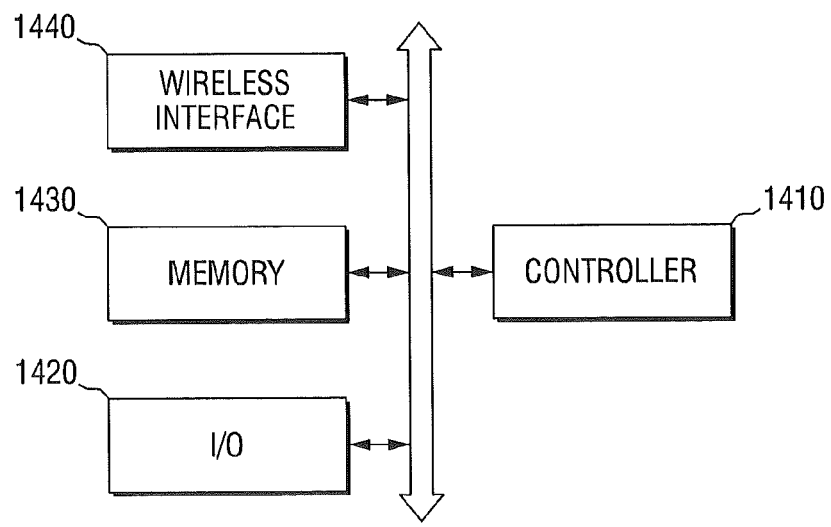
FIG. 26 is a block diagram illustrating the configuration of an electronic device including a semiconductor device fabricated according to an embodiment of the present invention.

FIG. 26 is a block diagram illustrating the configuration of an electronic device including the semiconductor device fabricated by the method for fabricating the semiconductor device according to the embodiments of the present invention.

Referring to FIG. 26, an electronic device 1400 may include a semiconductor device fabricated according to various embodiments of the present invention. The electronic device 1400 may be used in wireless communication devices (for example, a PDA, a notebook, a portable computer, a web tablet, a wireless phone, and/or a wireless digital music player) or various devices that send and receive information in wireless communication environments.

The electronic device 1400 may include a controller 1410, an input/output device 1420, a memory 1430, and a wireless interface 1440. The memory 1430 may include the semiconductor device fabricated according to various embodiments of the present invention. The controller 1410 may include a microprocessor, a digital signal processor, or a similar processor. The memory 1430 may be used to store commands (or user data) processed by the controller 1410. The wireless interface 1440 may be used to send and receive data through a wireless data network. The wireless interface 1440 may include an antenna and/or wireless transceiver. The electronic device 1400 may use a third generation communication system protocol, such as CDMA, GSM, NADC, E-TDMA, WCDMA, or CDMA2000.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device comprising:
    forming a dummy gate pattern on a substrate;
    forming a spacer on a sidewall of the dummy gate pattern and on the substrate;
    forming a trench by etching the substrate at a side surface of the spacer;
    forming a semiconductor pattern in the trench where the semiconductor pattern protrudes from the trench above a top surface of the substrate;
    forming a first recess by removing at least part of the spacer;
    forming an air gap on both sides of the dummy gate pattern by forming a blocking film that covers the first recess and the dummy gate pattern;
    exposing the substrate by removing the dummy gate pattern; and
    sequentially forming a gate insulating film including a high-k insulating film and a metal gate electrode on the exposed substrate.

2. The method for fabricating the semiconductor device of claim 1, wherein forming the first recess comprises:
    forming an interlayer insulating film that at least partially covers a sidewall of the spacer and exposes a top surface of the spacer; and
    forming the first recess in the interlayer insulating film by removing at least part of the spacer.

3. The method for fabricating the semiconductor device of claim 2, further comprising conformally forming a liner within the first recess.

4. The method for fabricating the semiconductor device of claim 2, wherein removing at least part of the spacer comprises leaving a lower part of the spacer on the substrate.

5. The method for fabricating the semiconductor device of claim 1, wherein a part of the blocking film fills up an upper portion of the first recess while leaving the air gap in a lower portion of the first recess.

6. The method for fabricating the semiconductor device of claim 5, wherein removing the dummy gate pattern comprises:
    exposing the dummy gate pattern by smoothing the blocking film; and
    forming a trench that exposes the substrate in the interlayer insulating film by etching the exposed dummy gate pattern.

7. The method for fabricating the semiconductor device of claim 1, further comprising forming an air gap spacer on the sidewall of the dummy gate pattern.

8. The method for fabricating the semiconductor device of claim 7, wherein forming the air gap spacer comprises:
    forming a filler that fills up the first recess; and
    forming a second recess by removing a part of the filler.

9. The method for fabricating the semiconductor device of claim 8, further comprising removing the filler after forming the air gap spacer.

10. A method of fabricating a semiconductor device, the method comprising:
    forming a first gate electrode and a second gate electrode on a substrate;
    forming an interlayer pattern between the first and second gate electrodes;
    conformally forming a first layer on the first and second gate electrodes and on the interlayer pattern; and then
    forming a blocking film on the first and second gate electrodes and on the interlayer pattern,
    wherein the blocking film only partially fills a first air gap between the first gate electrode and the interlayer pattern, and only partially fills a second air gap between the second gate electrode and the interlayer pattern.

11. The method of fabricating the semiconductor device of claim 10, the method further comprising the following steps prior to formation of the first layer:
    forming a first spacer on a first sidewall of the first gate electrode and forming a second spacer on a second sidewall of the second gate electrode; and
    removing the first and second spacer to form the first and second air gaps.

12. The method of fabricating the semiconductor device of claim 11, wherein the first and second gate electrodes comprise first and second dummy gate electrodes, the interlayer pattern comprises a patterned interlayer insulating film, and the first layer comprises a liner layer the method further comprising:
    removing the first and second dummy gate electrodes; and
    forming first and second metal gate electrodes in place of the first and second dummy gate electrodes.

13. The method of fabricating the semiconductor device of claim 11, the method further comprising:
    forming a trench by etching the substrate between the first and second spacers, and
    forming a semiconductor pattern in the trench, the semiconductor pattern protruding above a top surface of the substrate.

14. The method of fabricating the semiconductor device of claim 10, wherein the first and second gate electrodes comprise first and second dummy gate electrodes, the interlayer pattern comprises a patterned interlayer insulating film, and the first layer comprises a liner the method further comprising the following steps after forming the liner but prior to forming the blocking film:
    forming a filler on the liner that fills up the first and second air gaps;
    forming a first recess and a second recess by removing respective first and second portions of filler;
    forming a first air gap spacer on a sidewall of the first recess and forming a second air gap spacer on a sidewall of the second recess; and removing the filler after forming the first and second air gap spacers.

* * * * *